(12) United States Patent
Fuse et al.

(10) Patent No.: US 7,187,106 B2
(45) Date of Patent: Mar. 6, 2007

(54) POSITIONING MECHANISM, EXPOSURE APPARATUS AND DEVICE MANUFACTURING METHOD

(75) Inventors: Naoto Fuse, Utsunomiya (JP); Hiroshi Ito, Fuchu (JP); Makoto Mizuno, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 166 days.

(21) Appl. No.: 10/898,444

(22) Filed: Jul. 23, 2004

(65) Prior Publication Data
US 2005/0035684 A1 Feb. 17, 2005

(30) Foreign Application Priority Data

Jul. 31, 2003 (JP) ............................. 2003/204675
Jul. 7, 2004 (JP) ............................. 2004/200709

(51) Int. Cl.
*H01L 41/04* (2006.01)
*H01L 41/08* (2006.01)

(52) U.S. Cl. ........................ 310/328; 310/90.5; 310/51; 355/72; 355/75; 384/107

(58) Field of Classification Search ............... 310/90.5, 310/51; 355/72, 75; 384/107
See application file for complete search history.

(56) References Cited

U.S. PATENT DOCUMENTS 5,438,174 A * 8/1995 Slade .......................... 218/118
6,029,959 A * 2/2000 Gran et al. .................. 267/136
6,129,185 A * 10/2000 Osterberg et al. ......... 188/267.2
6,327,026 B1 * 12/2001 Wakui .......................... 355/72
6,688,439 B2 * 2/2004 Bhattacharya et al. ...... 188/267
6,888,620 B2 * 5/2005 Lee et al. ..................... 355/73
2001/0052970 A1 * 12/2001 Sato ............................ 355/72
2006/0012258 A1 * 1/2006 Sun et al. ................... 310/90.5

FOREIGN PATENT DOCUMENTS

| JP | 55112440 A | * | 8/1980 |
| JP | 11-044834 | | 2/1999 |
| JP | 11-233039 | | 8/1999 |

* cited by examiner

Primary Examiner—Darren Schuberg
Assistant Examiner—J. Aguirrechea
(74) Attorney, Agent, or Firm—Morgan & Finnegan, LLP

(57) ABSTRACT

The present invention provides a positioning mechanism and an exposure apparatus that can be used in a vacuum ambience and has a damping function with small degassing and small dust creation. A positioning mechanism according to the present invention, when used with first and second members, serve to position the second member with respect to the first member, wherein the positioning mechanism include a positioning portion capable of relatively positioning the second member relative to the first member, and an attenuating material provided at least at a portion of a periphery of the positioning portion.

26 Claims, 15 Drawing Sheets

POSITIONING MECHANISM, EXPOSURE APPARATUS AND DEVICE MANUFACTURING METHOD

FIELD OF THE INVENTION AND RELATED ART

This invention relates to a precision driving system and, more particularly, to a structure for precisely adjusting the position or attitude of an optical element such as a lens or a mirror of an exposure apparatus to be used in the process of manufacturing semiconductor devices or liquid crystal devices. Specifically, the invention concerns a driving system that is to be used in an exposure apparatus for projecting an image of an original such as a mask or a reticle onto an object workpiece such as a wafer, and that is arranged to precisely adjust the position or attitude of an optical element to assure an accurate imaging relationship. The invention is directed also to an exposure apparatus or the like using such driving system. The driving system according to the present invention can be used not only for adjustment of the position or attitude of an optical element of an optical apparatus such as an exposure apparatus but also it can be applied to an apparatus such as a sample table of an electronic microscope, for example, wherein high-precision positioning in a vacuum ambience free from dust or special outgassing, is required.

Semiconductor exposure apparatus is an apparatus for transferring many varieties of patterns of originals (reticles) to a silicon wafer (substrate). In order to produce a large-integrated circuit, not only progress of the resolving performance but also improvement of the registration precision is indispensable.

In such exposure apparatus, if external vibration outside the exposure apparatus is transmitted to an optical element such as, for example, a mirror of an EUV (extreme ultraviolet) exposure apparatus, it directly causes degradation of the resolving performance or a decrease of the registration precision. Thus, damping systems have been developed to suppress transmission of external vibration to optical elements, to thereby improve the resolving performance or registration precision.

An example of such damping system is disclosed in Japanese Laid-Open Patent Application, Publication No. 11-44834 wherein a squeeze effect of a viscous material such as an oil or grease is used. FIG. 9 is a fragmentary and perspective view of an actuator with a damping function, having a viscous material 34. This figure illustrates an actuator arranged to adjust an output of a flange 32 by adjusting the pressure inside a bellows 31 through a pressure controller (not shown). The viscous material 34 is nipped at a small clearance defined inside the bellows 31, by which an attenuation effect is produced at once. A clean damping system can be provided in this manner, without emission of outgassing from the viscous material 34, for example. Depending on the sealing method for the viscous material, this damping system may be used also in a vacuum environment, not only for exclusion of the effect of the unwanted outgassing.

Another example of a damping mechanism to be used in a vacuum ambience is disclosed in Japanese Laid-Open Patent Application, Publication No. 11-233039, wherein friction is used.

However, in the method as disclosed in Japanese Laid-Open Patent Application, Publication No. 11-044834, the damping effect may change with time due to the influence of repeated vibration, or it needs many structural parts and complicated assembling works.

In the method used in the damping system disclosed in Japanese Laid-Open Patent Application, Publication No. 11-233039, since the damping is based on friction, it inevitably causes dust creation. In this sense, it is very difficult to apply the damping system such as disclosed in Japanese Laid-Open Patent Application, Publication No. 11-233039 to an EUV exposure apparatus wherein the presence of only a small dust leads to a critical problem.

SUMMARY OF THE INVENTION

It is accordingly an object of the present invention to provide a positioning system and/or an exposure apparatus having a damping mechanism to be used in a vacuum ambience, with small degassing and small dust creation.

In accordance with an aspect of the present invention, to achieve this object, there is provided a positioning mechanism to be used with first and second members, for positioning the second member with respect to the first member, said positioning mechanism comprising: a positioning portion capable of relatively positioning the second member relative to the first member; and an attenuating material provided at least at a portion of a periphery of said positioning portion.

In one preferred form of this aspect of the present invention, the positioning portion has a polygonal-rod shape.

The positioning portion may be expandable and contractable in a first direction, and the sectional shape of said positioning portion along a plane perpendicular to the first direction may be polygonal.

The positioning mechanism may further comprise a first expandable and contractable member provided to cover the outer periphery of said positioning portion, and an attenuating material sealingly provided between said positioning portion and said first expandable and contractable member.

The attenuating material may be provided in close contact to said positioning portion.

A positioning mechanism in another form of this aspect of the present invention may further comprise a first expandable and contractable member for connecting the first and second members with each other and being provided to cover the outer periphery of said positioning portion, a second expandable and contractable member for connecting the first and second members with each other and being provided to cover the outer periphery of said first expandable and contractable member, and an attenuating material sealingly provided between said first and second expandable and contractable members.

A positioning mechanism in another form of this aspect of the present invention may further comprise a first magnetic force producing member fixed to the first member and producing a first magnetic force, and a second magnetic force producing member fixed to the second member and producing a second magnetic force being repulsive to the first magnetic force, wherein said first and second magnetic force producing members are disposed inside said first expandable and contractable member and/or in a space surrounded by said first expandable and contractable member.

A positioning mechanism in another form of this aspect of the present invention may further comprise a first magnetic force producing member fixed to the first member and producing a first magnetic force, and a second magnetic force producing member fixed to the second member and producing a second magnetic force being repulsive to the first magnetic force.

In the positioning mechanism described above, an area of a surface of said second magnet being perpendicular to the line of magnetic force and an area of a surface of said first magnet being perpendicular to the line of magnetic force may be different from each other.

The positioning mechanism may further comprising a third magnetic force producing member fixed to the second member and producing a third magnetic force being repulsive to the first magnetic force.

The first, second and third magnetic force producing members may be disposed inside said first expandable and contractable member and/or in a space surrounded by said first expandable and contractable member.

The positioning mechanism may be disposed in a vacuum ambience.

In accordance with another aspect of the present invention, there is provided an exposure apparatus, comprising: a positioning mechanism in any one of the forms as recited above, for positioning a wafer stage on which an object to be exposed is placed or to be placed; and exposure means for exposing the object to be exposed, being positioned by said positioning mechanism.

In accordance with a further aspect of the present invention, there is provided an exposure apparatus, comprising: at least one optical element for directing light from a light source to an object to be exposed; and a positioning mechanism in any one of the forms as recited above, for positioning said at least one optical element.

In one form of this aspect of the present invention, the exposure means may include at least one reflection optical element for directing light of a wavelength of 13–14 nm to the object to be exposed, to thereby expose the object to be exposed.

In accordance with a yet further aspect of the present invention, there is provided a device manufacturing method, comprising the steps of: exposing an object to be exposed, by use of an exposure apparatus as recited above; and developing the exposed object.

In accordance with a still further aspect of the present invention, there is provided a piezoelectric actuator being expandable and contractable in a predetermined direction, comprising: a piezoelectric device being expandable and contractable in said predetermined direction; and an attenuating material surrounding at least a portion of a periphery of said piezoelectric device.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
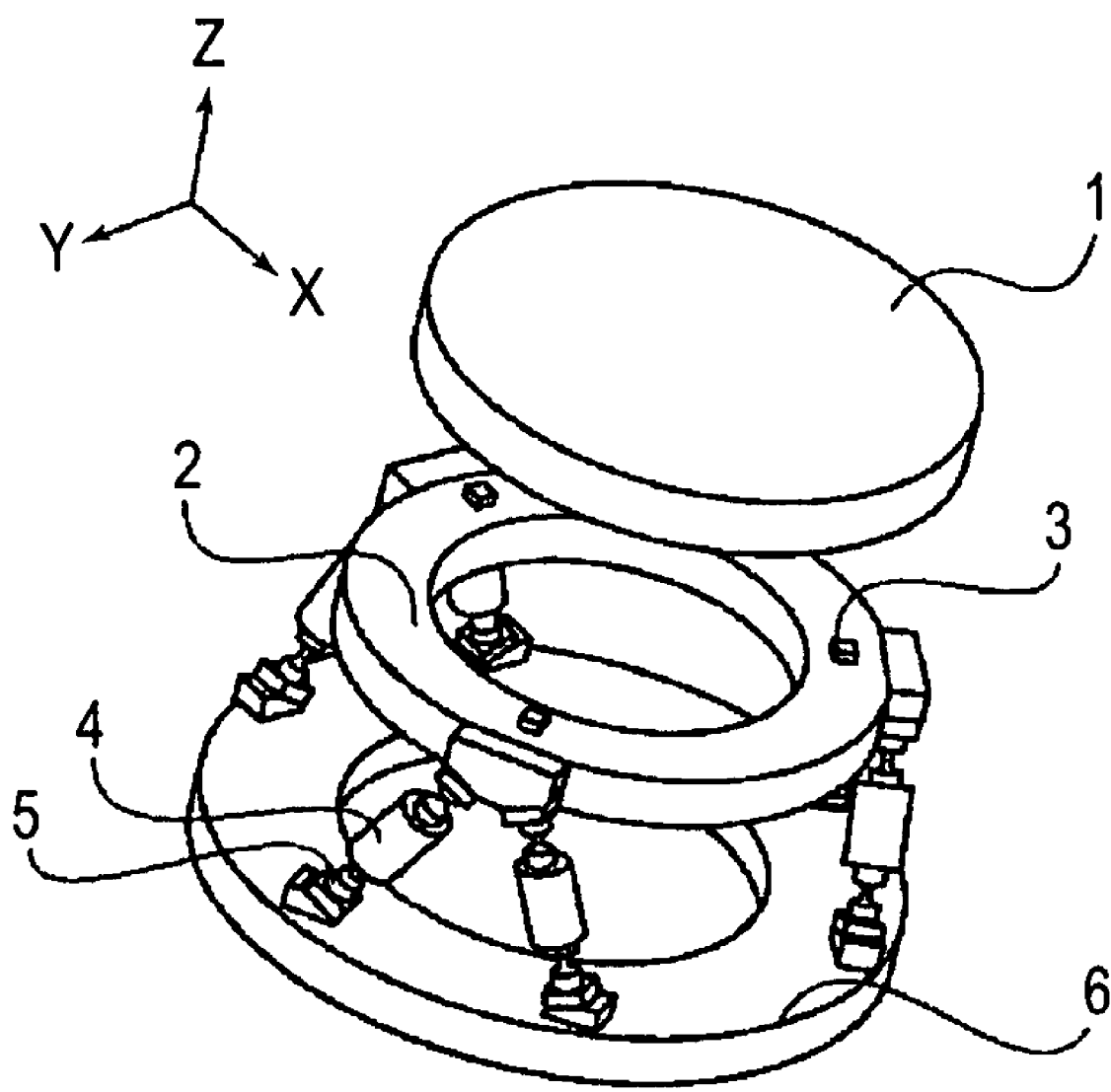
FIG. 1 is a perspective view of a general structure of an optical-element holding and adjusting system using a parallel linkage mechanism.

A positioning mechanism according to one preferred form of the present invention comprises a positioning portion being provided to connect first and second members with each other and being capable of relatively positioning the second member relative to the first member, and an attenuating material provided at least at a portion of the periphery of the positioning portion.

A positioning mechanism according to another preferred form of the present invention comprises a positioning portion being provided to connect first and second members with each other and being capable of relatively positioning the second member relative to the first member, and a first expandable and contractable member which connects the first and second members with each other and which is provided so as to cover the outer periphery of the positioning portion, wherein an attenuating material is provided between the positioning portion and the first expandable and contractable member. Here, the attenuating material may desirably be provided in close contact with the positioning portion.

A positioning mechanism according to a further preferred form of the present invention comprises a positioning portion being provided to connect first and second members with each other and being capable of relatively positioning the second member relative to the first member, a first expandable and contractable member which connects the first and second members with each other and which is provided so as to cover the outer periphery of the positioning portion, and a second expandable and contractable member which connects the first and second members with each other and which is provided so as to cover the outer periphery of the first expandable and contractable member, wherein an attenuating material is provided between the first and second expandable and contractable members.

Here, the attenuating material may desirably be provided at a position spaced away from the positioning portion. Furthermore, the positioning portion may desirably have a piezoelectric device.

A still further preferred form of the present invention is directed to a positioning mechanism for positioning a second object with respect to a first object, the positioning mechanism comprising a first magnetic force producing member fixed to the first member and producing a first magnetic force, a second magnetic force producing member fixed to the second member and producing a second magnetic force being repulsive to the first magnetic force, and an expandable and contractable member for connecting the first and second members with each other, wherein an attenuating material is provided inside the expandable and contractable member and/or in a space surrounded by the expandable and contractable member.

Here, the an area of a surface of the second magnet being perpendicular to the line of magnetic force and an area of a surface of the first magnet being perpendicular to the line of magnetic force, may desirably be different from each other. Furthermore, the first and second magnetic force producing members may desirably be disposed inside the expandable and contractable member and/or in a space surrounded by the expandable and contractable member.

A yet further preferred form of the present invention is directed to a positioning mechanism for positioning a second member with respect to a first member, the positioning mechanism comprising a first magnetic force producing member fixed to the first member and producing a first magnetic force, a second magnetic force producing member fixed to the second member and producing a second magnetic force being repulsive to the first magnetic force, a third magnetic force producing member fixed to the second member and producing a third magnetic force being repulsive to the first magnetic force, and an expandable and contractable member for connecting the first and second members with each other, wherein an attenuating material is provided inside the expandable and contractable member and/or in a space surrounded by the expandable and contractable member. Here, the first, second and third magnetic force producing members may desirably be provided inside the expandable and contractable member and/or in a space surrounded by the expandable and contractable member. Furthermore, the third magnetic force producing member may desirably comprise a permanent magnet.

Further, at least one of the first and second magnetic force producing members may desirably comprise a permanent magnet.

The expandable and contractable member may desirably comprise any one of a metal bellows, a rubber material, an expandable and contractable mechanism having an elastic coefficient, and an expandable and contractable mechanism having an attenuation (damping) coefficient.

A still further preferred form of the present invention concerns a piezoelectric actuator sealingly accommodated in a casing, wherein it comprises a piezoelectric device of polygonal sectional shape along a plane perpendicular to the driving axis thereof, wherein the casing for sealingly accommodating the piezoelectric device therein has a polygonal shape, and wherein there is a flange at an end of the casing while a diaphragm is connected to the other end.

A yet further preferred form of the present invention is directed to a positioning mechanism (piezoelectric actuator) that comprises a piezoelectric device having a polygonal sectional shape along a plane orthogonal to the driving axis thereof (i.e. the piezoelectric device has a polygonal-rod shape such as quadrangular rod shape or octagonal rod shape, for example), a casing having a polygonal shape for sealingly accommodating the piezoelectric device therein (i.e. the casing has a polygonal-rod shape), a flange disposed at an end of the casing, and a flange disposed at the other end through an expandable and contractable member. Here, an attenuating material may desirably be sealingly provided in the clearance between the casing and the piezoelectric device. Furthermore, the expandable and contractable member may desirably comprise any one of a metal bellows, a rubber material, an expandable and contractable mechanism having an elastic coefficient, and an expandable and contractable mechanism having an attenuation (damping) coefficient. The attenuating material may desirably comprise any one of a damping rubber, a high-polymer series material, and a rubber material.

The flange may desirably be provided with a connector member for transmission of an electric signal. The connector may desirably be of hermetically sealed type.

In the positioning mechanisms described above, the positioning mechanism may desirably be disposed in a vacuum.

Another preferred form of the present invention is directed to an exposure apparatus for exposing an object to be exposed, wherein it comprises a stage being capable of positioning the object to be exposed, and a positioning mechanism according to any one of the preferred forms described above.

A further preferred form of the present invention concerns an exposure apparatus for exposing an object to be exposed, by directing light from a light source to the object to be exposed through at least one optical element, wherein it comprises a positioning mechanism according to any one of the preferred forms described above.

A yet further preferred form of the present invention is directed to an exposure apparatus that comprises an illumination optical system for illuminating a mask with light from a light source, a projection optical system for directing light from the mask to an object to be exposed, a first stage for moving the mask, and a second stage for moving the object to be exposed, wherein the positioning of at least one of the first and second stages is carried out by use of a positioning mechanism according to any one of the preferred forms described above.

The exposure apparatus described above may be an EUV exposure apparatus for performing exposure by use of EUV (extreme ultraviolet) light having a wavelength of 13–14 nm. It may desirably include at least one reflection optical element for directing the EUV light to the object to be exposed. More preferably, all the optical elements for directing the EUV light to the object to be exposed, may be reflection optical elements.

A device manufacturing method according to one preferred form of the present invention comprises a step of exposing an object to be exposed, by use of an exposure apparatus according to any one of the preferred forms described above, and a step of developing the exposed object.

Another preferred form of the present invention concerns a piezoelectric actuator being expandable and contractable in a predetermined direction, wherein it comprises a piezoelectric device being expandable and contractable in the predetermined direction, and an attenuating material provided to surround at least a portion of the periphery of the piezoelectric device.

Now, some preferred embodiments of the present invention will be described below, with reference to the attached drawings.

[First Embodiment]

Figure 2:
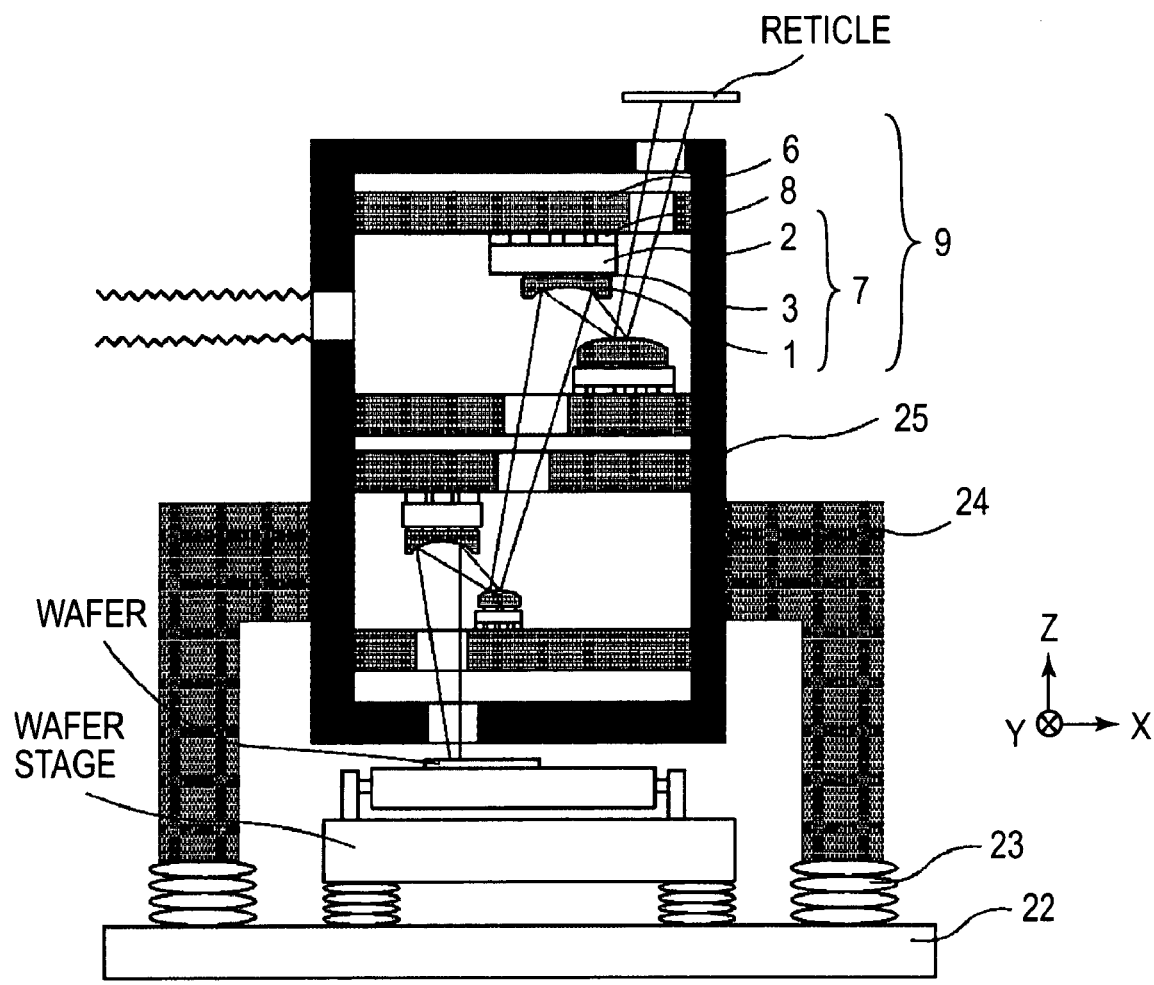
FIG. 2 is a schematic view of a general structure of an exposure apparatus into which an optical-element holding and adjusting mechanism is incorporated.

FIG. 2 is a schematic view of a general structure of an exposure apparatus having incorporated therein holding means 3 for an optical element 1 and an attitude adjusting mechanism (adjusting system and positioning system) 8 according to the present invention.

As an example, this exposure apparatus is a reduction projection exposure apparatus (EUV exposure apparatus) using extreme ultraviolet light (EUV light) having a wavelength of bout 10–15 nm, being yet shorter than the ultraviolet ray. It functions to transfer, by exposure, a pattern formed on a reticle (original) placed on a reticle stage onto a wafer (object to be exposed) placed on a wafer stage. Here, the reticle stage and the wafer stage are driven in synchronism with each other in accordance with the projection magnification (¼ in this example), by which the pattern of the reticle is transferred to the wafer. The projection optical system comprises four mirrors, in this example. However, the present invention is not limited to it, and six mirrors or eight mirrors may be used. Alternatively, the mirror number may be three, five, seven or more, but use of mirrors of an even number is preferable.

The inside of the exposure apparatus using extreme ultraviolet light is kept approximately at vacuum. The exposure apparatus comprises a light emitting device (not shown), an illumination optical system (not shown) for illuminating a reticle with light from the light emitting device, and a reflection type projection optical system (it may include a small number of refraction optical elements or diffractive optical elements, but preferably it may consist of reflection optical elements only) for directing light from the reticle to a wafer. The positioning mechanism (optical-element holding and adjusting system) 9 of the present invention is provided inside this projection optical system or inside the illumination optical system. It functions to hold the optical element 1 (mirror in this example) and simultaneously to adjust the attitude thereof so as to satisfy a desired optical characteristic of the projection optical system or of the illumination optical system (i.e. to keep the aberration of the optical system in a predetermined range). Although details are not described here, the attitude adjustment (adjustment of the mirror position, the mirror angle, etc.) may be carried out by measuring the wavefront aberration of the projection optical system and on the basis of the thus obtained measurement result. Alternatively, the temperature of a mirror or mirrors (at least one mirror, but preferably all the mirrors) of the projection optical system may be measured, and the attitude adjustment may be made on the basis of it. The shape of a mirror or mirrors (at least one mirror, but preferably all the mirrors) of the projection optical system may be measured, and the attitude adjustment may be made on the basis of it. As a further alternative, the adjustment may be carried out in accordance with any combination of the results of these measurements. Moreover, a program may be stored into the exposure apparatus which program functions to automatically adjust the attitude of a mirror or mirrors inside the projection optical system in accordance with the time elapsed from the exposure start (initiation of actual exposure transfer) and on the basis of the reticle pattern and the irradiation time of extreme ultraviolet rays, for example, i.e. on the basis of an exposure program (a program that determines the relation between patterns and manners of exposures to be performed to such patterns). As a matter of course, the mirror attitude adjustment may be carried out on the basis of any combination of such automatic adjustment program and the measurement results.

In the exposure apparatus shown in FIG. 2, there is a structural body frame 24 which is mounted on a floor 22 through an anti-vibration system 23. The structural body frame 24 supports a barrel 25 of the projection optical system. In FIG. 2, only the projection optical system is supported by the structural body frame 24. However, the frame 24 may be arranged to support the illumination optical system or, alternatively, to support both of the illumination optical system and the projection optical system.

FIG. 1 illustrates an example of optical-element holding and adjusting system 9. The optical element 1 is held by an intermediate block (movable block) 2 through holding means 3 at three locations. The intermediate block 2 is arranged so that the position and attitude thereof can be adjusted by means of the attitude adjusting mechanism 8. Thus, by controlling the attitude adjusting mechanism, the position or attitude of the optical element 1 can be adjusted.

Here, the gravity center of the geometrical triangle defined by the three holding means 3 and the gravity center of the optical element 1 are approximately registered with each other, except the component in a direction perpendicular to the plane defined by that triangle. With this structure (arrangement), the load of the optical element can be distributed to the three holding means approximately uniformly. In order to reduce deformation of the optical element 1 due to thermal expansion thereof or in order to improve the assembling reproducibility, these holding means 3 may use a kinematic mounting method based on a combination of a ball and a V-shaped groove, a combination of a ball and a cone (conical shape recess), or a combination of a ball and a polygonal pyramid (a triangular pyramid is preferable, but a quadrangular or pentagonal pyramid may be used). Here, the "ball" may not be a complete sphere. It may be an approximately spherical member having a spherical shape at least at the portion to be contacted to the V-shaped groove, cone or polygonal pyramid. Similarly, as regards the V-shaped groove, the cone and the polygonal pyramid, what is required is that the portion to be contacted to the approximately spherical member has a V-groove shape, a conical shape or a polygonal pyramid shape. Thus, in this sense, it can be said that they may be an approximately V-shaped groove, an approximately conical-shape recess, and an approximately polygonal-pyramid shape recess.

In this embodiment, as an example, the attitude adjusting mechanism 8 comprises three parallel linkage mechanisms of bipod type, each including a resilient hinge 5 and driving means 4, for example. In the parallel linkage mechanisms, through individual motions (expansion or contraction) of six driving means 4, the movable portion 7 (intermediate block 2, holding means 3 and optical element 1, in this example) can be moved with six freedoms (i.e. its position and attitude can be adjusted) relatively to the fixed block 6. As regards the driving means 4, while a laminated type piezoelectric device may generally be used, a hydraulic actuator such as a cylinder or a bellows, a motor or a feed screw can be used. The structure of the attitude adjusting mechanism is not limited to what described above. Any other structure may be used, provided that the position and attitude of the intermediate block 2 can be adjusted with six freedoms. Among the three parallel linkage mechanisms described above, one may be arranged so that the movable block (or movable portion) can be moved relatively to the fixed block only in an approximately vertical direction (a direction in which the distance between the fixed block and the movable block is prolonged or shortened; in other words, a direction perpendicular to the geometrical triangle defined by the three holding means 3). In that occasion, as a matter of course, the movable block can be moved relatively to the fixed block, with five freedoms only.

By the way, where the optical element 1 is mechanically connected to the floor 22 as by the attitude adjusting mechanism 8 and the holding means 3 of this embodiment, there is a possibility that the optical element 1 vibrates as a result of external vibration from the floor 22, for example, outside the exposure apparatus. In that occasion, depending on the magnitude of vibration (magnitude of amplitude) of the optical element, the optical performance of the optical system as a whole may be degraded.

Figure 3:
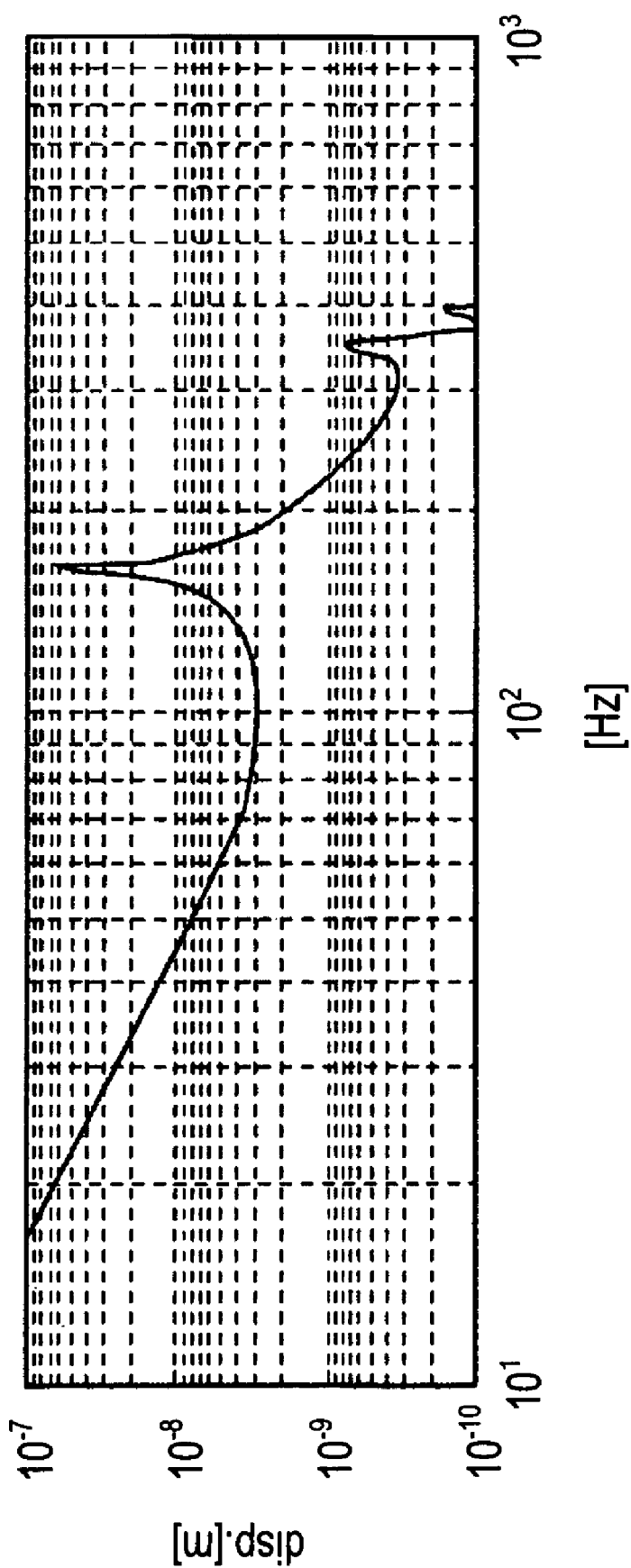
FIG. 3 is a graph showing an external-disturbance vibration characteristic of an optical element.

In this connection, FIG. 3 shows the result of estimating calculation on the vibration (frequency vs. amplitude) of the optical element 1 in a case wherein, as an example, pulse vibration of an acceleration 10 gal (0.1 m/s$^2$) is applied to the floor 22. In this example, while taking into account the composite spring constant and mass, for example, of the attitude adjusting mechanism 8 and the holding means 3, the calculation was made on an assumption that the natural frequency of the optical-element holding and adjusting system as a whole is about 150 Hz and the attenuation factor (damping factor) is 0.05. It is seen from the result shown in FIG. 3 that, at the natural frequency (about 150 Hz) of the optical element 1 described above, there occurs vibration of an amplitude of about 70 nm. In terms of optical performance, if the required tolerable amplitude of the optical element 1 is smaller than this value, any one of the following measures may be necessary.

1. Reducing external vibration to be transmitted from the floor 22.
2. Suppressing external vibration through the anti-vibration system (damper) 23.
3. Arranging the optical-element holding and adjusting system 9 to increase its natural frequency.
4. Adding an attenuating system to enlarge the attenuation factor of the optical-element holding and adjusting system 9.

In the first embodiment, among these measures, item No. 4 "Adding an attenuating system to enlarge the attenuation factor of the optical-element holding and adjusting system 9" was employed.

Generally, as regards attenuation method for a mechanical structure, use of a vibration isolating rubber including gel, an air spring or friction is known prevalently. However, these methods are difficult to be used in practice because of dust creation, or presence of degassing which is inappropriate in an environment where an exposure apparatus is placed, or from the standpoint of adaptability to a vacuum environment. In this embodiment, in consideration of this, the actuator of the attitude adjusting mechanism 8 comprises a sealed piezoelectric actuator (piezoelectric device) having a metal bellows, for example, in which an attenuating material having a high attenuation (damping) factor is sealingly accommodated. The system as a whole of the attitude adjusting mechanism 8 is thus structured to provide attenuation with an attenuation factor more than 0.03, for example. With this arrangement, since the attenuating material is sealingly accommodated inside the actuator, the problem of degassing can be solved. Additionally, because the attenuating material is sealingly accommodated within the actuator, it is no more necessary to use additional attenuating elements. Thus, while saving the space, vibration of the mechanical structure can be attenuated.

Figure 4:
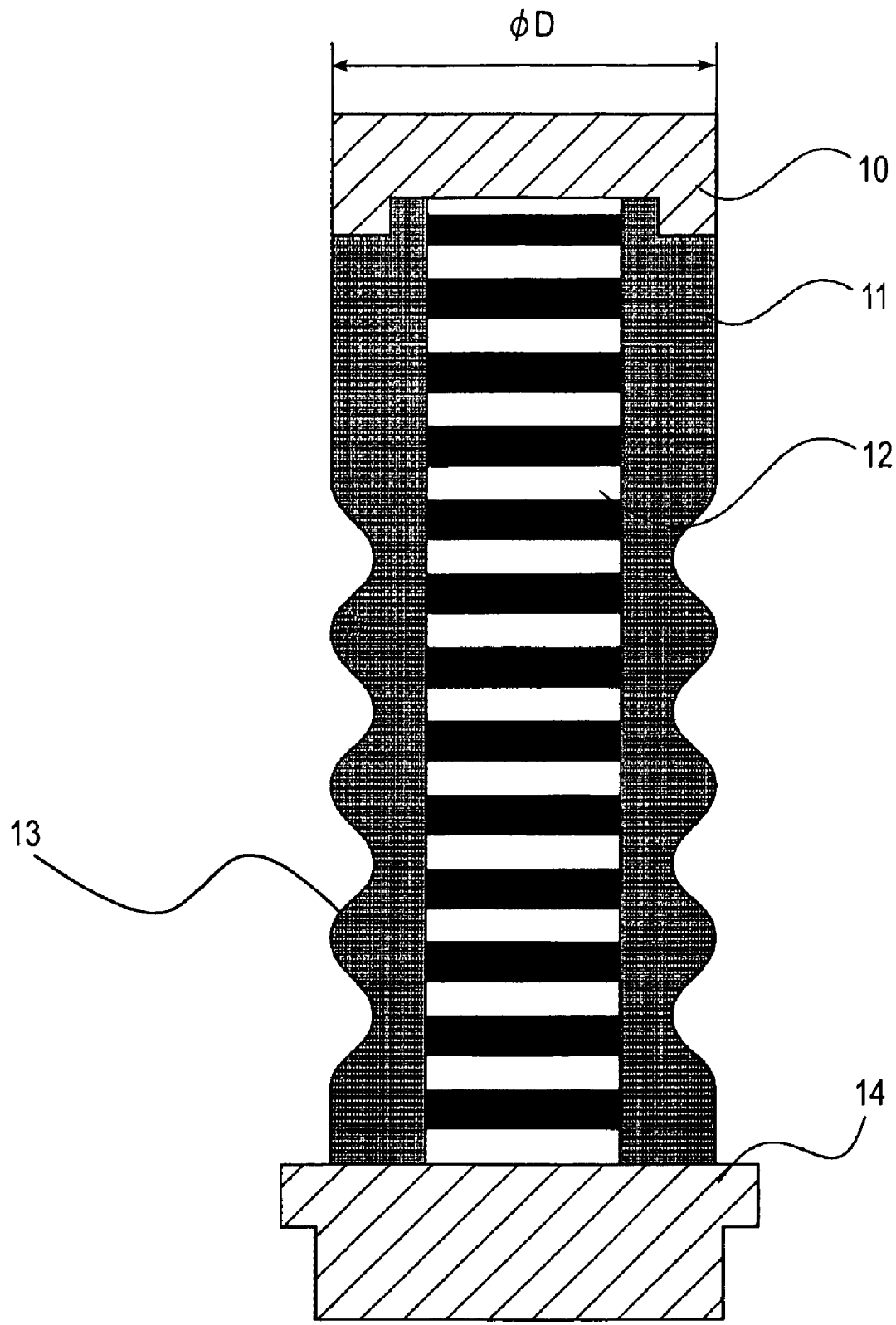
FIG. 4 is a schematic view of a piezoelectric actuator (single bellows type) having an attenuating function.

FIG. 4 illustrates a section of a piezoelectric actuator having an attenuating material sealingly accommodated therein. More specifically, this is a piezoelectric actuator with an attenuating function, that comprises a pair of flanges 10 and 14, an expandable and contractable tube 13 (which may be a metal bellows, a rubber material, an expandable and contractable mechanism having an elastic coefficient, or an expandable and contractable mechanism having an attenuation factor), and a piezoelectric device 12, wherein, as a characterizing feature, there is an attenuating material 11 provided at the clearance between the piezoelectric device 12 and the expandable and contractable tube 13. The flanges are connected to the expandable and contractable tube by means of welding, for example, to thereby intercept communication with the outside. In FIG. 4, the attenuating material (damping material) 11 is provided to cover the whole peripheral surface (side surface) of the piezoelectric device. However, the attenuating material may be provided only at a position corresponding to a portion of the side surface of the piezoelectric device. For example, the attenuating material may be provided so as to cover a ring-like zone having a predetermined width with respect to the expansion/contraction direction of the piezoelectric device. Alternatively, the attenuating material may be provided at a position corresponding to a stripe-like region being parallel to the expansion/contraction direction of the piezoelectric device.

The expandable and contractable tube 13 may preferably be a metal bellows (expandable and contractable member having a tubular or cylindrical shape, surrounding the outer peripheral surface of the piezoelectric device), from the standpoint of degassing or dust creation. As regards the attenuating material, a damping rubber, a high-polymer series damping material, or a rubber material may be used.

The diameter D of the bellows may be changed to adjust the attenuation factor of the actuator. More particularly, by changing the bellows diameter without changing the outside diameter of the piezoelectric device 12, the clearance that accommodates the attenuating material is changed, such that the relative amount of the attenuating material occupying the volume of the piezoelectric actuator is changed. Thus, the attenuation factor of the piezoelectric actuator as a whole can be adjusted thereby. It is desirable that the attenuating material is applied to fill the whole clearance between the bellows and the actuator, since it avoids unevenness and reduces the possibility of individual differences.

In this embodiment, the piezoelectric device 12, the expandable and contractable tube 13 and the attenuating material 11 are provided in parallel, in the manner connecting the pair of flanges. However, it is not necessary that the attenuating material 11 extends to connect the flanges. For example, a rubber material may be wound as like a ring, around a central portion of the piezoelectric device. The manner of disposition of the attenuating material is not limited to it, as a mater of course. Similar advantageous effects are obtainable by any other arrangement, provided that the attenuating material is provided so as to cover at least a portion of the piezoelectric device.

By applying the actuator having a structure such as described above to the driving means 4 for the mechanism shown in FIG. 1, for example, an attenuating element is added and a desired positional precision and stability is accomplished while saving the space.

Figure 5:
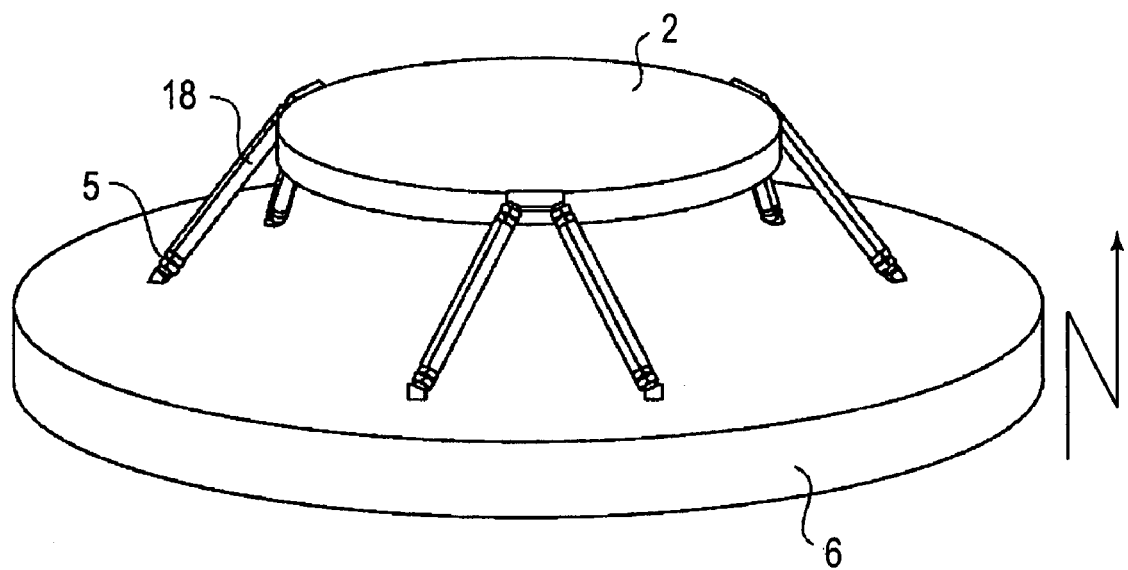
FIG. 5 is a conceptual view for vibration characteristic analysis.
Figure 6:
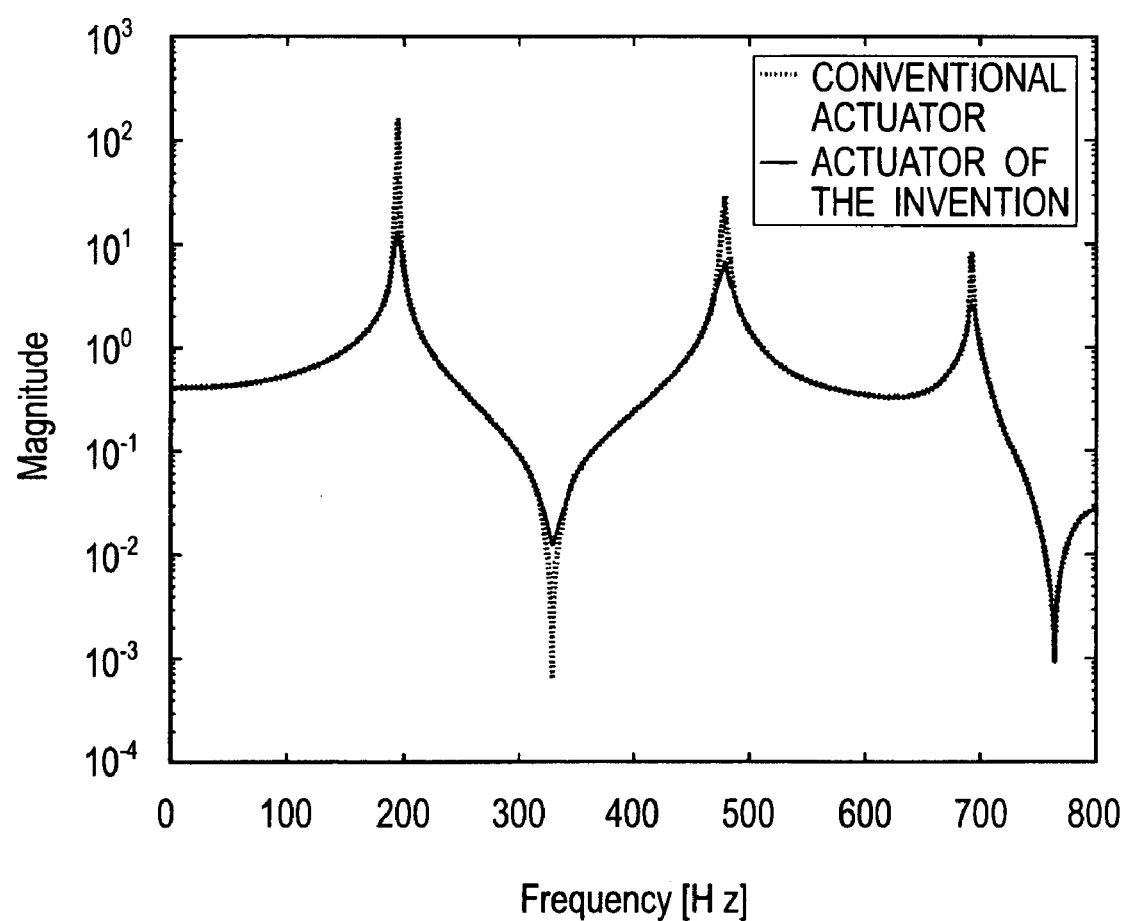
FIG. 6 is a graph for vibration characteristic comparison of the optical-element holding and adjusting mechanism.

FIG. 5 is a conceptual view for calculation of vibration characteristic of an optical-element adjusting mechanism into which a piezoelectric actuator of the present invention is incorporated.

Calculation was made to the frequency response at the center of the intermediate block (movable portion) 2, with respect to the vibration amplitude of the fixed block 6. FIG.

6 shows the result of calculation. Broken-line curve depicts the frequency response in a case where an actuator having no attenuation is used. Solid-line curve depicts the frequency response in a case where a piezoelectric actuator of the present invention is used.

It is seen from the calculation result that, when the piezoelectric actuator having an attenuation function according to the present invention is used, a resonance magnification (about 200) at a frequency about 200 Hz is reduced to 11 and that the response of the intermediate block 2 to the external vibration is attenuated considerably. In other words, propagation of vibration between the movable portion and the fixed block can be reduced significantly, that is, vibration propagated to the movable portion from the fixed block is reduced, or transmission factor of vibration from the fixed block to the movable portion is decreased.

[Second Embodiment]

Figure 7:
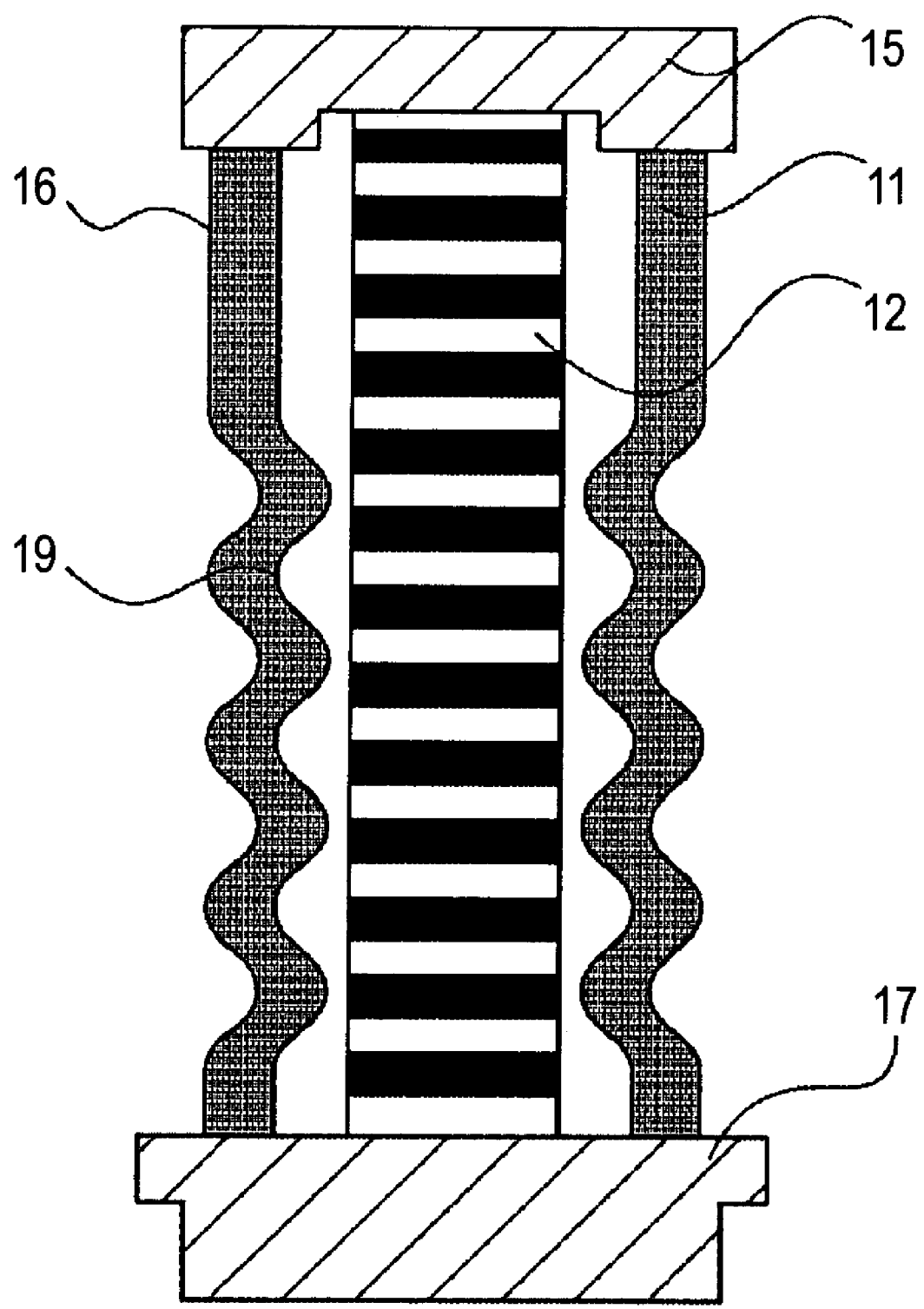
FIG. 7 is a schematic view of a piezoelectric actuator (double bellows type) having an attenuating function.

In the second embodiment, in addition to a metal bellows 19 (hereinafter, "first metal bellows"), there is a second metal bellows 16 which is disposed outside the first metal bellows 19 and is provided concentrically with the first metal bellows 19. It is not necessary that these bellows have exactly registered centers in a strict sense. The centers of them may be deviated by an amount not greater than ⅕ (more preferably, not greater than 1/10) of a radius of a circumscribed circle in the section of either one of the two bellows. An attenuating material may be sealingly accommodated in the clearance between the first and second metal bellows and, in that occasion, an attenuating element can be added without direct contact to the piezoelectric device. FIG. 7 illustrates a sectional view of a piezoelectric actuator having an attenuating material sealingly accommodated therein, the attenuating material being out of contact with a piezoelectric device, such as described above.

A preload is desirable for stable operation of the piezoelectric device. To this end, one having a large rigidity may be chosen for the first (inner) metal bellows 19 (first expandable and contractable tube) shown in FIG. 7, so that it functions as a spring member for applying a preload to the piezoelectric device. The second (outer) metal bellows 16 (second expandable and contractable tube) is a member for sealingly accommodating the attenuating material, and one having a lower rigidity as compared with the inner bellows may be chosen therefor. When an end of the first (inner) metal bellows 19 is welded, the second (outer) bellows 16 may be contracted toward the other end to facilitate the filling operation of the attenuating material.

Figure 8:
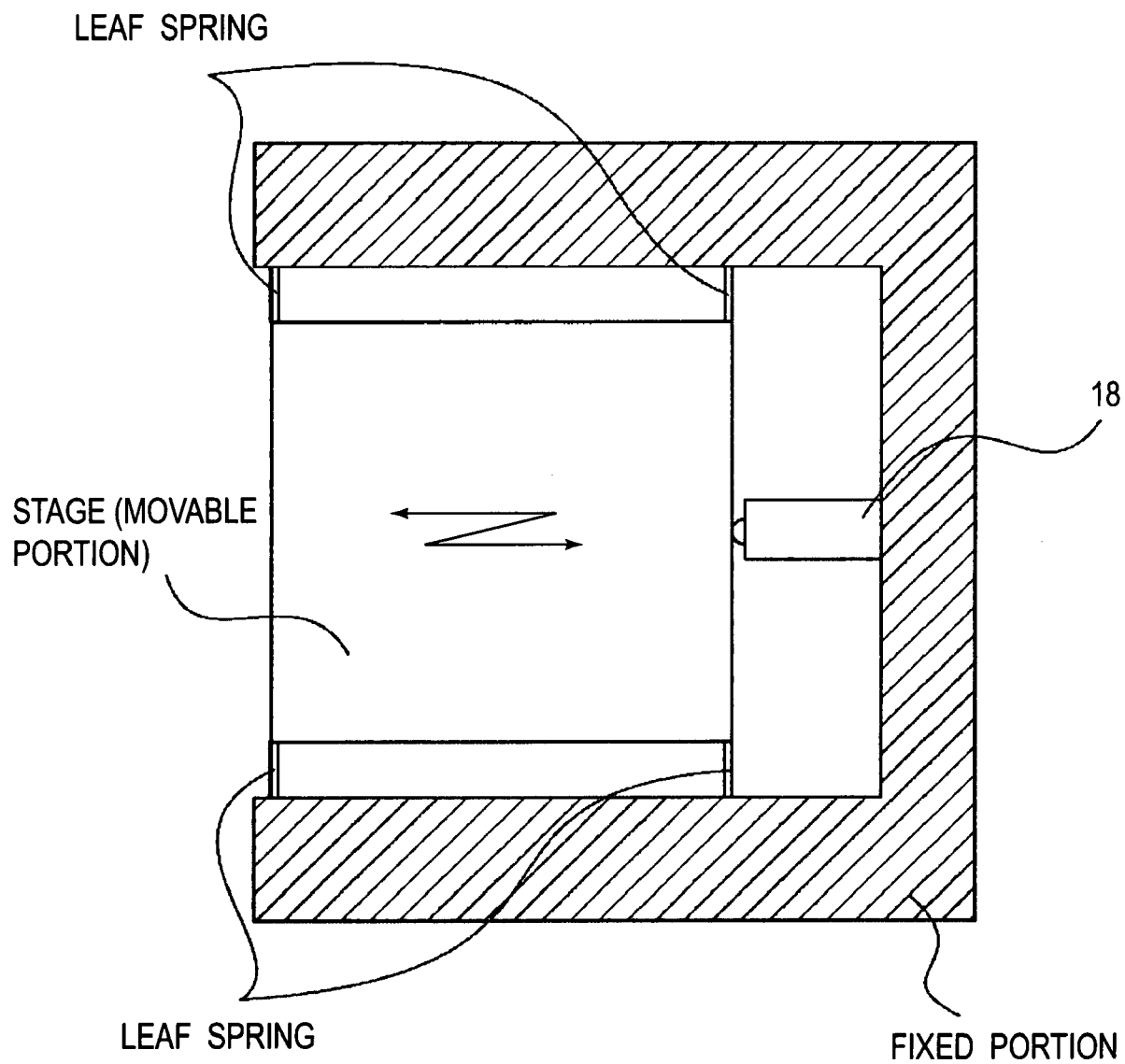
FIG. 8 is a perspective view of a general structure of a positioning fine-motion stage having a piezoelectric actuator with an attenuating material sealingly provided therein.
Figure 9:
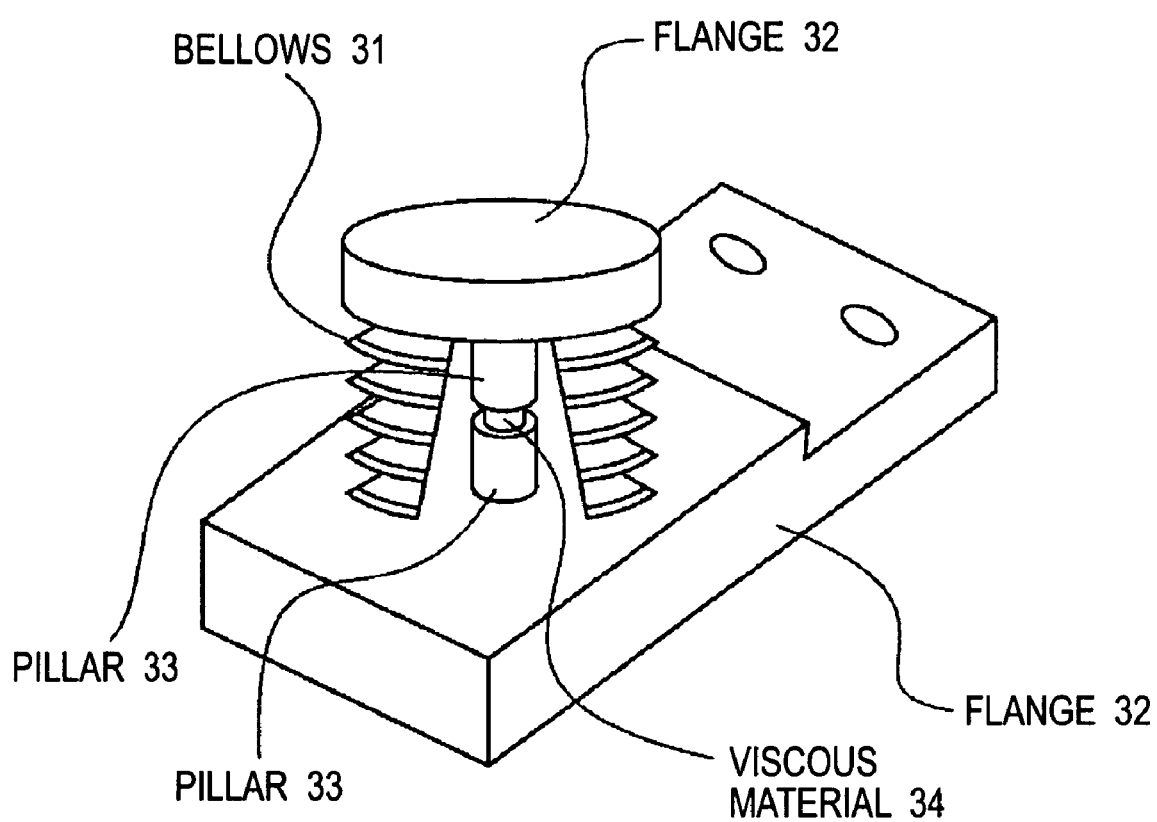
FIG. 9 is a perspective view of a damping system using a viscous and elastic material.

The actuator in this embodiment or in the first embodiment described hereinbefore can be applied not only to a parallel linkage mechanism shown in FIG. 1 but also to a stage system such as shown in FIG. 8, having leaf springs and an actuator 18 with attenuation function. This mechanism uses two pairs of leaf springs as a motion guide (guide member), and it functions to transmit displacement of the actuator 18 as strait motion of the movable portion. Such mechanism can be applied to a scanning stage in a microscope, for example. Since vibration from the outside the apparatus should be intercepted as much as possible, the stage as a whole should have a large attenuation factor.

The attenuation mechanisms such as described with reference to the first embodiment or the second embodiment may be used in any combination. For example, a damping rubber material may be wound around the peripheral surface of the piezoelectric device (actuator), and additionally an attenuating material (e.g. gel-like material) may be applied to the outside portion of it. Furthermore, in addition to the structure of the second embodiment in which an attenuating material is sealingly provided between the first and second metal bellows, an attenuating material may be sealingly provided between the first metal bellows and the piezoelectric device.

The metal bellows provided around the piezoelectric device may be replaced by an expandable and contractable mechanism which is made from an expandable and contractable rubber material, for example, and which has an elastic coefficient and/or attenuation factor (any mechanism may be used provided that it is an expandable and contractable mechanism having a spring function and a damper function as well), and the mechanism may be arranged to provide a large attenuating function. As an example, a rubber material may be wound around the peripheral surface of the expandable and contractable mechanism, or the peripheral surface of the mechanism may be covered by a gel-like material.

[Third Embodiment]

Figure 10:
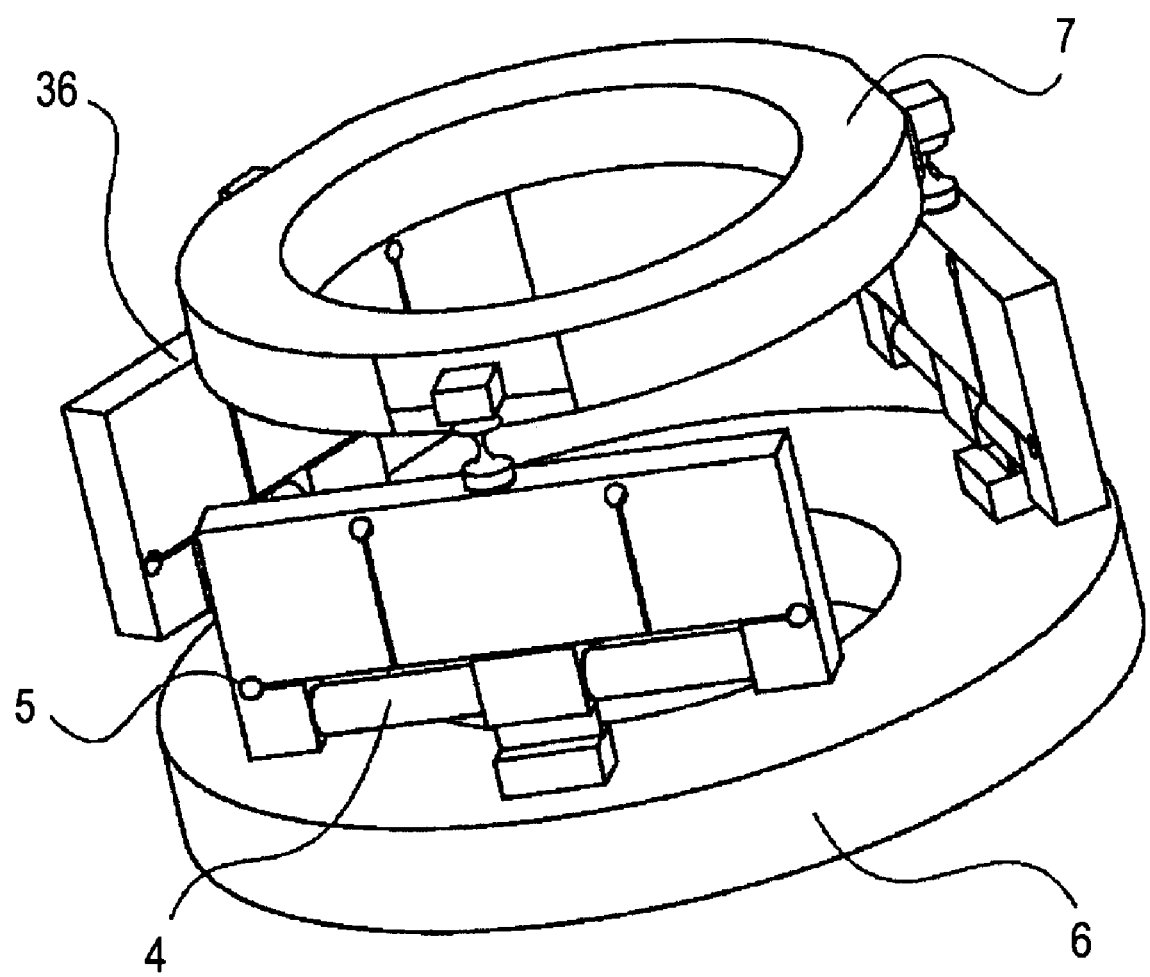
FIG. 10 is a perspective view of a general structure of a differential parallel linkage mechanism.

FIG. 10 is a perspective view of a general structure of a differential type parallel linkage mechanism according to a third embodiment of the present invention. In FIG. 10, some components such as optical element and holding means shown in FIG. 1, are not illustrated.

The movable portion 7 has a ring-like shape in FIG. 10, but it may have a circular shape like a mirror or lens (optical element), a polygonal shape (e.g. triangular or rectangular), a combined shape of arcuate (e.g. fan shape) and straight, or a combined shape of arcs having different curvature radii. Any other shape is usable, as a matter of course. As an alternative, the structure may be arranged so that the optical element 1 is indirectly connected to the movable portion 7 through the holding means.

Mounted between the movable portion 7 and the fixed block 6 are three integral type differential linkage mechanisms 36 which are disposed approximately equidistantly along the circumference. Between the integral type differential linkage mechanism 36 and the movable portion 7, and also between the differential linkage mechanism 36 and the fixed block 6, there are resilience hinges 5 being rotationally movable in a radial direction (a direction perpendicular to the surface of the differential linkage mechanism) and also in a tangential direction. Each hinge 5 may be replaced by two resilient hinges, that is, a hinge being rotationally movable in a radial direction and a hinge being rotationally movable in a tangential direction. Alternatively, a single resilient hinge being rotationally movable in one predetermined direction may be used. The resilient hinges 5 between the movable portion 7 and the differential linkage mechanism 36 and between the fixed block 6 and the differential linkage mechanism 36 may comprise a combination of resilient hinges having arcuate notches, or they may have a rotationally symmetrical shape.

Figure 11:
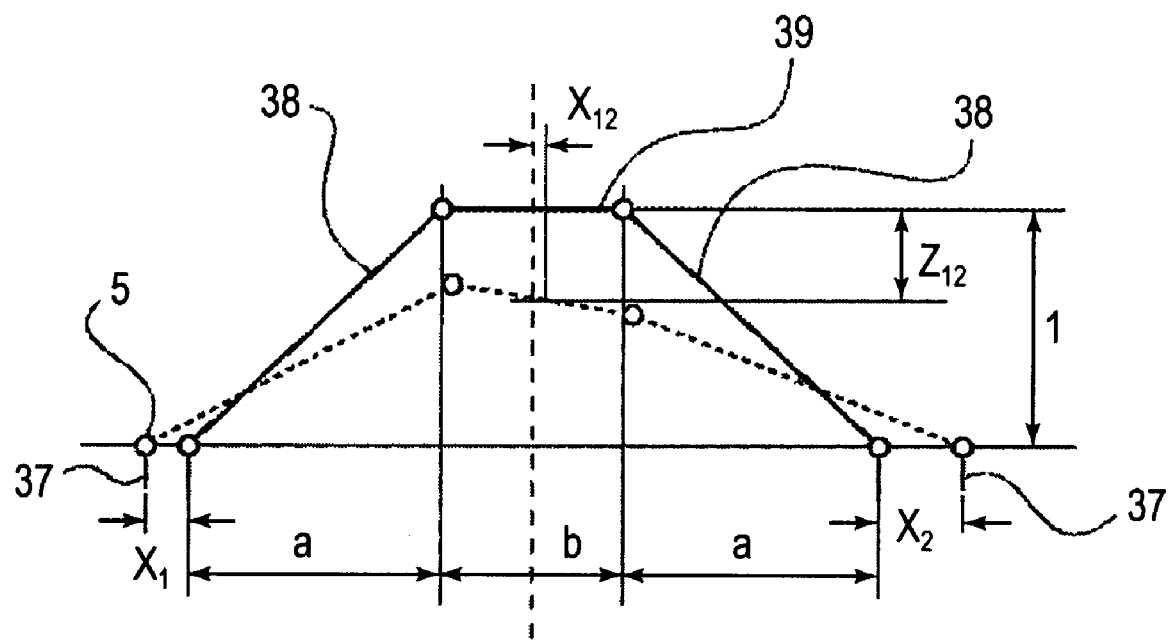
FIG. 11 is a schematic view for explaining a general structure and an operation of an integral type plane quadric linkage mechanism.

FIG. 11 illustrates a general structure and operation of an integral-type plane quadric linkage mechanism. Basically, it comprises a plane quadric (four-node) linkage mechanism, and total five links are connected in series, taking the resilient hinge 5 as rotational node. Input links 37 comprise first and fifth links among the five serial links. The links following it are two connection links 38. The link sandwiched between the two connection links 38 serves as an output link 39, and it is connected to the movable portion 7 through the resilient hinge 5 as described hereinbefore.

Now, input displacements produced by two driving means 4 are denoted by $x_1$ and $x_2$, respectively. With these input displacements, the resilient hinge 5 rotates and the output link 39 displaces by $x_{12}$ in a horizontal direction and by $z_{12}$ in a vertical direction.

This relation can be determined geometrically, and generally it can be expressed as follows.

$$z_{12} = \frac{1}{2}\frac{a}{l}(x_1 + x_2) \qquad (1)$$
$$x_{12} = \frac{x_2 - x_1}{2}$$

wherein a and l are parameters for determining the shape and they are such as shown in FIG. 11.

As regards the driving means 4 for such mechanism, a piezoelectric device 12, an actuator having a sealingly accommodated fluid such as a bellows 3 or a cylinder, or an electromagnetic type straight-motion actuator such as a linear motor may be used. Alternatively, a rotational motor may be used in combination with a straight-motion converting mechanism. A feed screw mechanism having a piezoelectric device as a drive source may be used similarly. Where a laminated type piezoelectric device 12 is used as the driving means 4 of the structure such as shown in FIG. 10, the mass of the movable portion serves as a force in a shearing direction of the laminated piezoelectric device. Since the laminated piezoelectric device has weakness at the force in shearing direction, it is desirable to provide a weight compensating function for canceling the mass of the movable portion.

Figure 12:
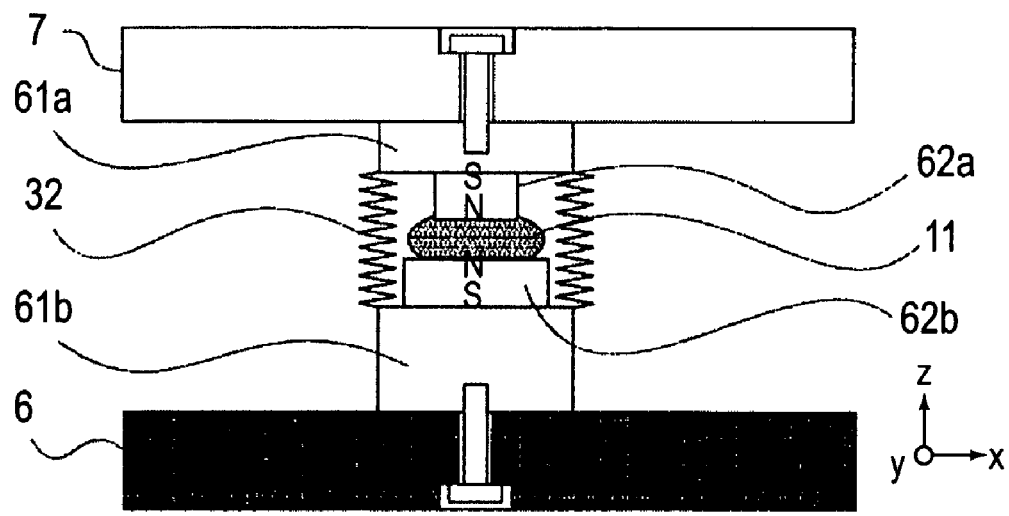
FIG. 12 is a schematic view of a z-direction damper.

This weight compensating function may preferably be provided by placing pairs of mutually repulsing magnets on the movable block and the fixed block, separately. If the magnets are provided at a single location, the movable block becomes unstable relative to the fixed block. Preferably, magnets may be provided at three locations on the movable block (movable portion), while magnets repulsing to them may be provided at three locations on the fixed portion. The magnets may be provided at more than three locations or at two locations. FIG. 12 illustrates an example of a structure for weight compensating function. There are permanent magnets between the movable portion 7 and the fixed block 6, and these magnets are disposed opposed to each other so that basically they repel to each other. The size and clearance of these magnets and the magnetic density thereof as well as the number of magnets should be designed in accordance with the mass of the movable portion. Although the magnet may desirably be a permanent magnet for simplicity of structure, it is not a requisition and an electromagnet, for example, may be used. In that occasion, however, the components such as a coil should desirably be provided at the fixed block side. As a further alternative, an electromagnet may be provided at the fixed block side, while a permanent magnet may be provided at the movable block (movable portion) side.

An attenuating material 11 is nipped between the opposed magnets, and two functions, that is, a weight compensating function and a function for applying attenuation mainly in Z direction, are provided. The attenuating material may use a high-polymer series damping material such as damping gel, or a damping rubber. However, since unwanted degassing has an adverse influence upon the exposure apparatus environment, it should desirably be covered by a metal bellows 32 as illustrated. For complete sealing, the opposite ends of the metal bellows should be directly welded to the magnets or, alternatively, as shown in FIG. 12, they may be welded to the flanges 61a and 61b, respectively, while the magnets and the flanges may be bonded by adhesion. The movable portion 7 and the flange 61a and, on the other hand, the fixed block 6 and the flange 61b should be fixed to each other through screws, for example.

In the case of magnetic-force repulsion weight compensation structure described in this embodiment, there is a tendency that a force applies in a direction (a direction along the x-y plane) perpendicular to the magnetic line of force. Thus, preferably, the two magnets should have different areas. Generally, the magnet 62a at the movable portion side is made smaller, while the magnet 62b at the fixed portion side is made larger, this being better because it does not enlarge the mass of the movable portion 7 to decrease the natural frequency of the system.

Figure 13:
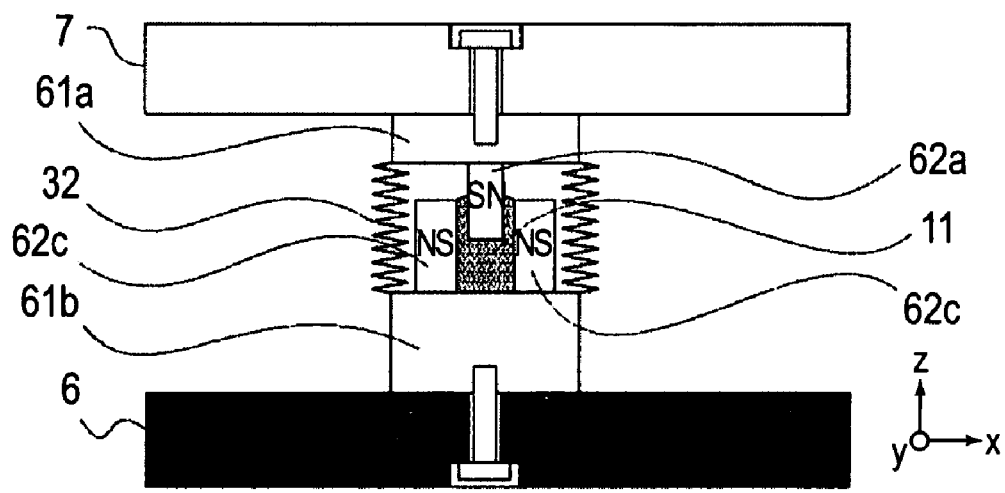
FIG. 13 is a schematic view of an x- and y-direction damper.

FIG. 13 shows another example of a structure for weight compensating function. There are total three magnets between the movable portion 7 and the fixed portion 2, and these magnets are disposed so that basically they repel to each other. An attenuating material 11 is nipped at the clearance between the magnets, and two functions, that is, a weight compensating function and an attenuating function, are provided. The attenuating material may use a high-polymer series damping material such as damping gel, or a damping rubber. Preferably, the attenuating material may be covered similarly by a metal bellows 32, as described hereinbefore. For complete sealing, the opposite ends of the metal bellows should be welded to the flanges 61a and 61b, respectively, while the magnets and the flanges may be bonded by adhesion, for example. The movable portion 7 and the flange 61a and, on the other hand, the fixed block 6 and the flange 61b should be fixed to each other through screws, for example.

The magnetic-force repulsion weight compensation structure described in this embodiment is effective particularly for the addition of attenuation force mainly in x direction. Thus, the method described with reference to FIG. 12 and the method described with reference to FIG. 13 may be combined, so that attenuation force may function in every one of X, Y and Z directions.

In accordance with the method described hereinbefore, both the weight compensation function for the movable portion and the attenuating function can be accomplished while saving the space, and yet as a measure that can meet vacuum ambience.

A driving mechanism for moving a movable portion relative to a fixed block may be provided separately as in the third embodiment, while the weight of the movable portion may be compensated for in the manner made in the above-described embodiment. However, the magnet (permanent magnet) in the third embodiment may be replaced by a magnetic-force producing device of magnetic-force adjustable type, such as an electromagnet, for example. In that occasion, it becomes possible to move the movable portion relative to the fixed block (fixed portion) by adjusting the magnetic force. In such structure, the driving mechanism and the attenuating mechanism can be combined into an integral unit, and it is preferable from the standpoint of reduction in size of the apparatus.

[Fourth Embodiment]

The piezoelectric actuator of the type shown in FIG. 4, being sealingly accommodated in the casing 40, has a circular shape in the section (along a plane perpendicular to the sheet of the drawing and perpendicular to the driving axis of the actuator). Where a driving mechanism using such actuator is designed, use of a polygonal sectional being represented by a rectangular shape is preferable for space saving. More specifically, it is desirable that the section of the piezoelectric actuator has a polygonal shape such as rectangular shape or octagonal shape, for example.

Figure 16A:
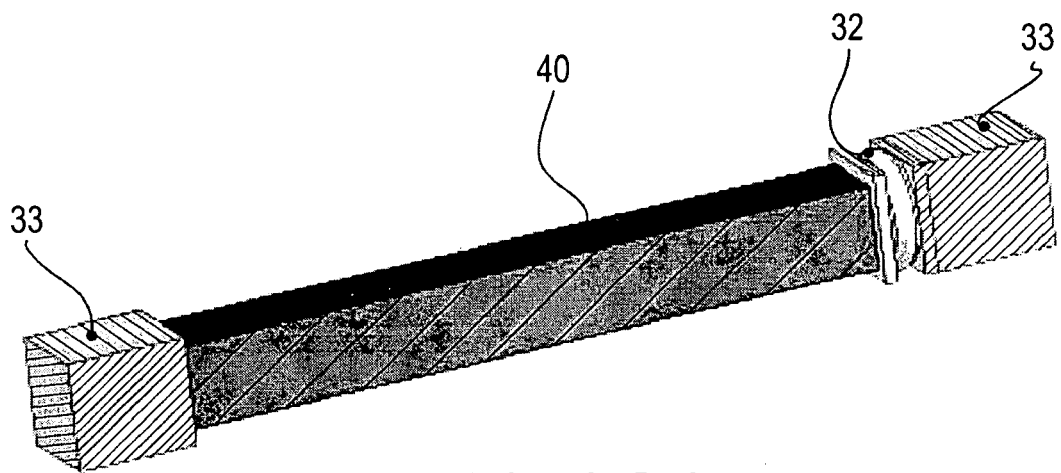
FIGS. 16A and 16B are schematic views of a piezoelectric actuator having a polygonal cross-sectional shape.
Figure 16B:
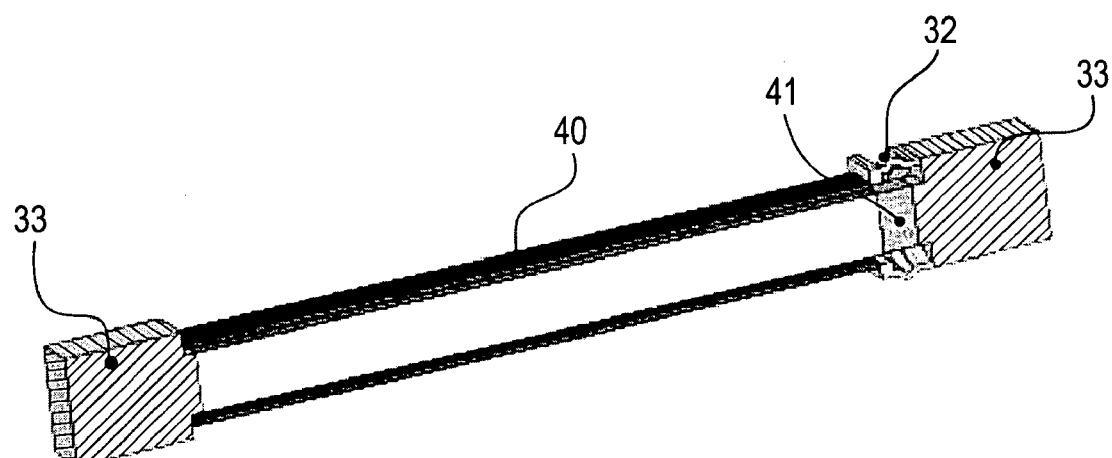

As an example, FIG. 16A is a perspective view of a piezoelectric actuator of the type being sealingly accommodated in a casing, having a rectangular sectional shape. FIG. 16B is a sectional and perspective view of the actuator of FIG. 16A. Electric wires and the like are not illustrated. The inside piezoelectric device has a rectangular shape in the section (the same as described) to follow the casing 40. However, the device itself may have a different shape from the casing 40, for example, a polygonal shape such as octagonal, for example, being defined by chamfering the four corners. Any other polygonal shape may be used, as a matter of course. A circular shape may be used, if no particular structural problem is raised thereby. Similarly, while the casing of the piezoelectric device should desirably have a rectangular shape such as square shape, a pentagonal shape may of course be used by chamfering.

The expansion and contraction of the containing material (casing) in it lengthwise direction due to the expansion/contraction of the piezoelectric device can be provided by using a diaphragm structure at the end portion of the casing 40, which structure can be deformed in the expansion/contraction direction of the piezoelectric device, or alternatively, by using a bellows 32 in a portion of the casing (the latter is illustrated in the drawing). Where a bellows is used at an end of the casing 40, a spacer 41 may be provided at a flange 33 as shown in FIG. 16B, or a step-like structure corresponding to the spacer (i.e. a shape having a step defined as a result of that the thickness of the flange portion is larger than the thickness of the casing 40, surrounding the piezoelectric device, in FIG. 16), may be used. This effectively avoids enlargement in size of the actuator. As regards the joint between the casing 40 and the flange 33 or the expandable and contractable member, use of welding or integral structure is preferable.

Like the embodiments described hereinbefore, a damping material such as a damping rubber or foam rubber or a high-polymer series material, may preferably be provided at the clearance between the casing 40 and the piezoelectric device.

Such damping material may be sealingly accommodated between the piezoelectric device and the casing, or alternatively, an inside wall and an outside wall may be provided in the casing portion and a damping material may be sealingly contained between the inside and outside walls. More preferably, the damping material may be provided in a portion being expanded or contracted, that is, between casing and the piezoelectric device at the bellows portion described above, or between the inside and outside walls of the bellows portion.

At least one of the flanges may desirably have a connector for connection with a wire for applying a voltage to the piezoelectric device, and preferably, it may comprise a hermetic seal for intercepting gas communication between the inside and the outside.

When the piezoelectric actuator is structured in accordance with this embodiment, an actuator system having a large sectional shape (i.e. large driving force) and saving the space can be accomplished, free from degassing or contamination.

The first to fourth embodiments described above can be combined as desired as long as they do not conflict with each other. Such a combined form is of course an aspect of the present invention.

[Fifth Embodiment]

Next, referring to FIGS. 14 and 15, an embodiment of a device manufacturing method which uses an exposure apparatus having a structure with a parallel linkage mechanism for enabling drive of an optical element, will be explained.

Figure 14:
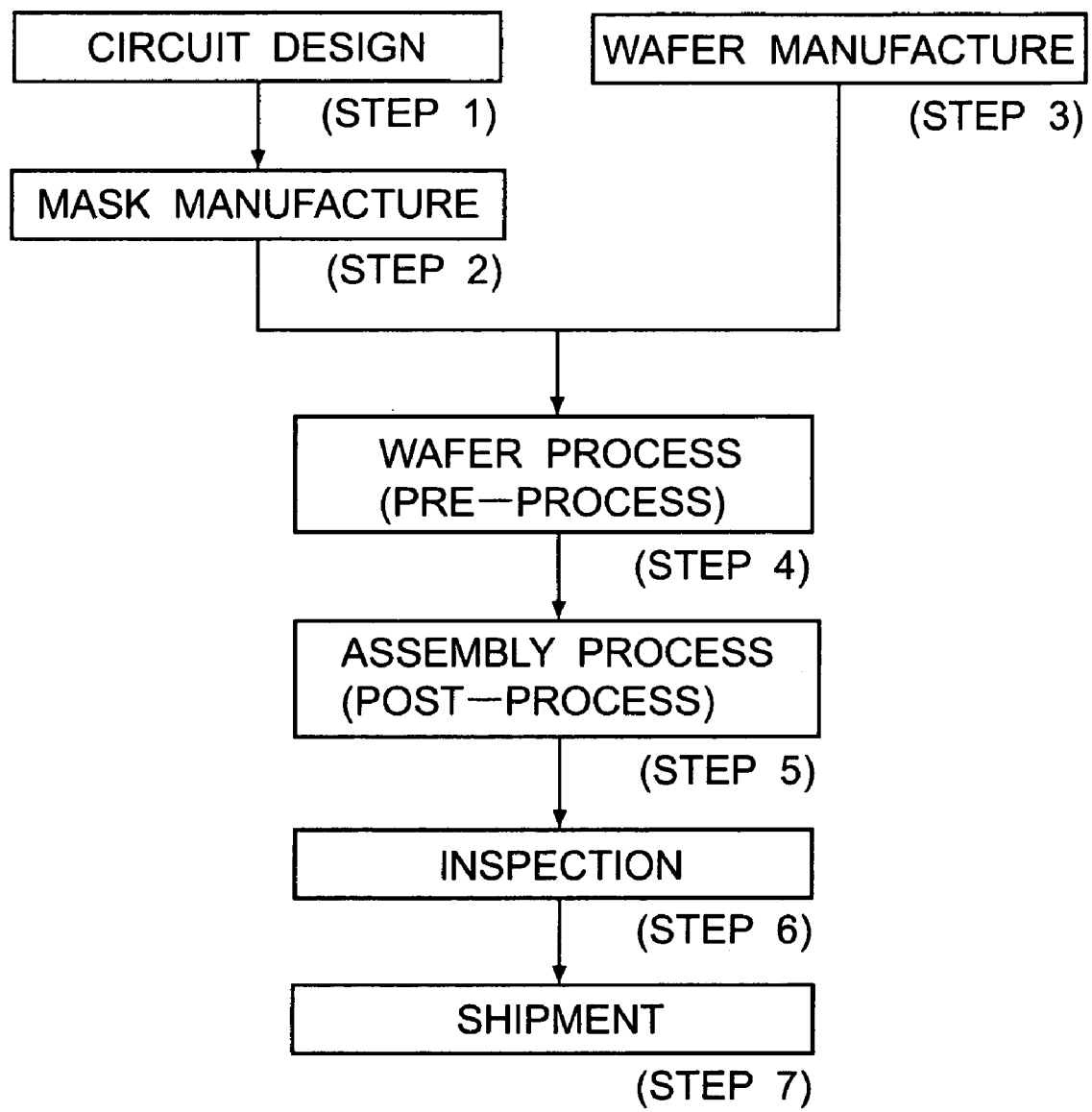
FIG. 14 is a flow chart for explaining the procedure of manufacturing devices such as semiconductor chips (e.g. IC or LSI), LCD and LCD, for example.

FIG. 14 is a flow chart for explaining the procedure of manufacturing various microdevices such as semiconductor chips (e.g., ICs or LSIs), liquid crystal display panels, or CCDs, for example. In this embodiment, description will be made to an example of semiconductor chip production. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the thus prepared mask and wafer, a circuit is formed on the wafer in practice, in accordance with lithography. Step 5 subsequent to this is an assembling step which is called a post-process wherein the wafer having been processed at step 4 is formed into semiconductor chips. This step includes an assembling (dicing and bonding) process and a packaging (chip sealing) process. Step 6 is an inspection step wherein an operation check, a durability check an so on, for the semiconductor devices produced by step 5, are carried out. With these processes, semiconductor devices are produced, and they are shipped (step 7).

Figure 15:
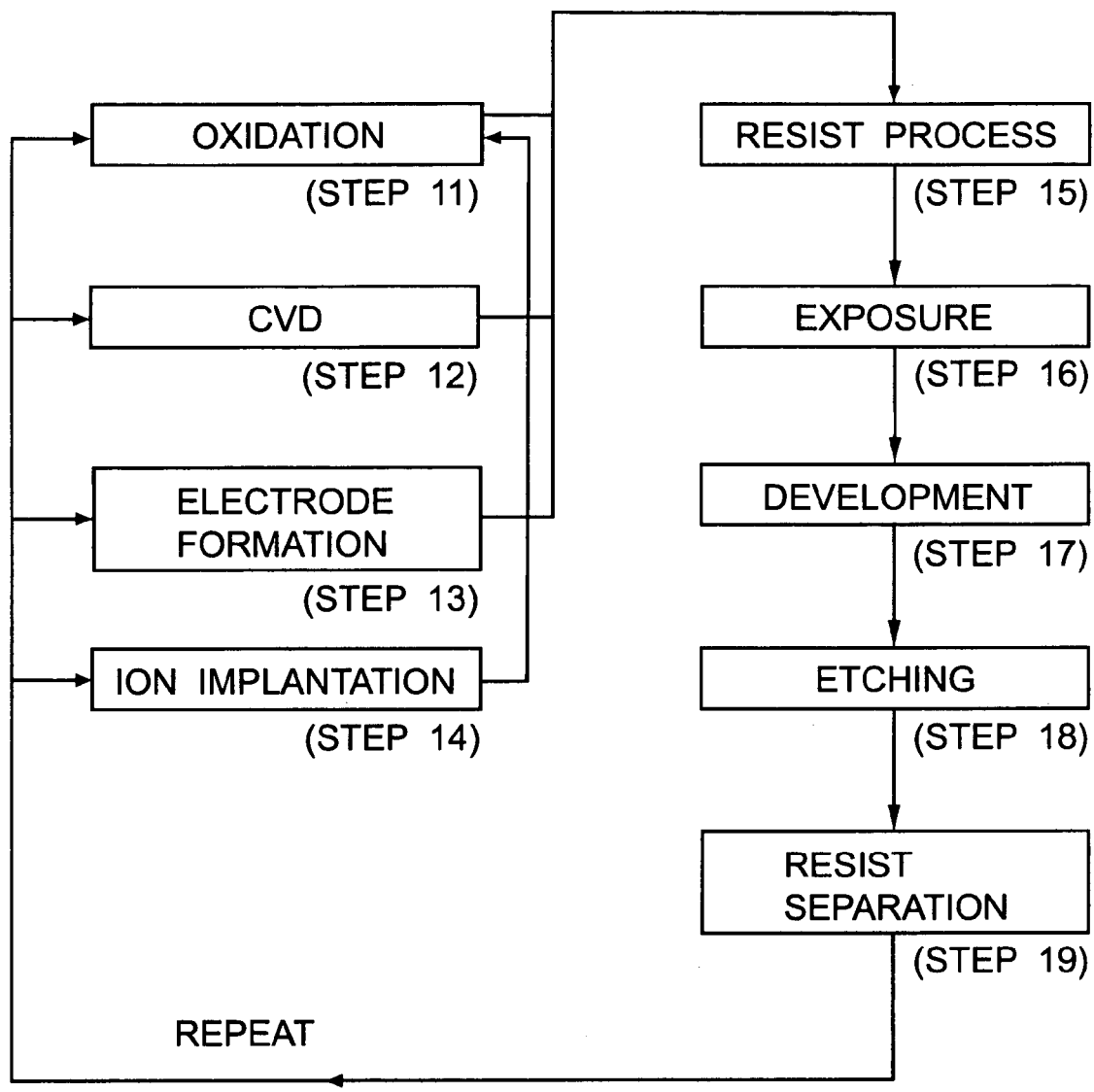
FIG. 15 is a flow chart for explaining details of a wafer process at Step 4 in FIG. 14.

FIG. 15 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer. Thus, in accordance with the device manufacturing method of this embodiment, higher-quality microdevices can be manufactured. Moreover, as described, a device manufacturing method that uses an exposure apparatus as well as a device as a product thereof are also in the scope of the present invention.

In accordance with the embodiments of the present invention as described hereinbefore, a clean damping system by which the inconveniences such as unwanted degassing or dust creation are solved can be incorporated into an apparatus which is disposed in a vacuum ambience. Particularly, when it is applied to an attitude adjusting system having a relatively small natural frequency and also a small attenuation factor, a high positional precision can be accomplished with compact disposition.

While the invention has been described with reference to the structures disclosed herein, it is not confined to the details set forth and this application is intended to cover such modifications or changes as may come within the purposes of the improvements or the scope of the following claims.

This application claims priority from Japanese Patent Applications No. 2003-204675 filed Jul. 31, 2003, and No. 2004-200709 filed Jul. 7, 2004, for which is hereby incorporated by reference.

What is claimed is:

1. An actuator comprising:
   a first member;
   a second member;
   an actuating portion capable of relatively positioning the second member relative to the first member;
   an expandable and contractable member for connecting the first and second members with each other and being provided to cover the outer periphery of said actuating portion; and
   an attenuating material sealingly provided between said actuating portion and said expandable and contractable member.

2. An actuator according to claim 1, wherein said actuating portion has a polygonal-rod shape.

3. An exposure apparatus, comprising:
   at least one optical element for directing light from a light source to an object to be exposed; and
   an actuator as recited in claim 2, for positioning said at least one optical element.

4. An actuator according to claim 1, wherein said actuating portion is expandable and contractable in a first direction, and wherein the sectional shape of said actuating portion along a plane perpendicular to the first direction is polygonal.

5. An exposure apparatus, comprising:
   at least one optical element for directing light from a light source to an object to be exposed; and
   an actuator as recited in claim 4, for positioning said at least one optical element.

6. An actuator according to claim 1, wherein said attenuating material is provided in close contact to said portion.

7. An exposure apparatus, comprising:
   at least one optical element for directing light from a light source to an object to be exposed; and
   an actuator as recited in claim 6, for positioning said at least one optical element.

8. An actuator A positioning mechanism according to claim 1, further comprising a first magnetic force producing member fixed to the first member and producing a first magnetic force, and a second magnetic force producing member fixed to the second member and producing a second magnetic force being repulsive to the first magnetic force, wherein said first and second magnetic force producing members are disposed in a space surrounded by said expandable and contractable member.

9. An exposure apparatus, comprising:
   at least one optical element for directing light from a light source to an object to be exposed; and
   an actuator as recited in claim 8, for positioning said at least one optical element.

10. An actuator to claim 1, further comprising a first magnetic force producing member fixed to the first member and producing a first magnetic force, and a second magnetic force producing member fixed to the second member and producing a second magnetic force being repulsive to the first magnetic force.

11. An actuator according to claim 10, wherein an area of a surface of said second magnetic force producing member being perpendicular to the line of magnetic force and an area of a surface of said first magnetic force producing member being perpendicular to the line of magnetic force are different from each other.

12. An exposure apparatus, comprising:
   at least one optical element for directing light from a light source to an object to be exposed; and
   an actuator as recited in claim 11, for positioning said at least one optical element.

13. An actuator according to claim 10, further comprising a third magnetic force producing member fixed to the second member and producing a third magnetic force being repulsive to the first magnetic force.

14. An actuator according to claim 13, wherein said first, second and third magnetic force producing members are disposed in a space surrounded by said expandable and contractable member.

15. An exposure apparatus, comprising:
   at least one optical element for directing light from a light source to an object to be exposed; and
   an actuator a positioning mechanism as recited in claim 14, for positioning said at least one optical element.

16. An exposure apparatus, comprising:
   at least one optical element for directing light from a light source to an object to be exposed; and
   an actuator as recited in claim 13, for positioning said at least one optical element.

17. An exposure apparatus, comprising:
   at least one optical element for directing light from a light source to an object to be exposed; and
   an actuator as recited in claim 10, for positioning said at least one optical element.

18. An actuator according to claim 1, wherein said actuator is disposed in a vacuum ambience.

19. An exposure apparatus, comprising:
   at least one optical element for directing light from a light source to an object to be exposed; and
   an actuator as recited in claim 18, for positioning said at least one optical element.

20. An exposure apparatus, comprising:
   an actuator as recited in claim 1, for positioning a wafer stage on which an object to be exposed is placed or to be placed; and
   exposure means for exposing the object to be exposed, being positioned by said actuator.

21. An apparatus according to claim 20, wherein said exposure means includes at least one reflection optical element for directing light of a wavelength of 13–14 nm to the object to be exposed, to thereby expose the object to be exposed.

22. A device manufacturing method, comprising the steps of:
   exposing an object to be exposed, by use of an exposure apparatus as recited in claim 21; and
   developing the exposed object.

23. An exposure apparatus, comprising:
   at least one optical element for directing light from a light source to an object to be exposed; and
   an actuator as recited in claim 1, for positioning said at least one optical element.

24. A device manufacturing method, comprising the steps of:
   exposing an object to be exposed, by use of an exposure apparatus as recited in claim 23; and
   developing the exposed object.

25. An actuator comprising:
   a first member;
   a second member;
   an actuating portion capable of relatively positioning the second member relative to the first member;
   a first expandable and contractable member for connecting the first and second members with each other and being provided to cover the outer periphery of said actuating portion;

a second expandable and contractable member for connecting the first and second members with each other and being provided to cover the outer periphery of said first expandable and contractable member; and an attenuating material sealingly provided between said first and second expandable and contractable members.

26. An exposure apparatus, comprising:

at least one optical element for directing light from a light source to an object to be exposed; and an actuator as recited in claim 25, for positioning said at least one optical element.

* * * * *

UNITED STATES PATENT AND TRADEMARK OFFICE
CERTIFICATE OF CORRECTION

PATENT NO. : 7,187,106 B2 Page 1 of 1
APPLICATION NO. : 10/898444
DATED : March 6, 2007
INVENTOR(S) : Naoto Fuse et al.

It is certified that error appears in the above-identified patent and that said Letters Patent is hereby corrected as shown below:

Column 17, line 38, delete "A position mechanism";

Column 18, line 14, delete "A position mechanism".

Signed and Sealed this

Twenty-sixth Day of June, 2007

JON W. DUDAS
*Director of the United States Patent and Trademark Office*